US011276840B2

(12) United States Patent
Nishimura et al.

(10) Patent No.: US 11,276,840 B2
(45) Date of Patent: Mar. 15, 2022

(54) DISPLAY DEVICE HAVING AN OPTICALLY TRANSPARENT PLATE

(71) Applicant: Japan Display Inc., Tokyo (JP)

(72) Inventors: Masumi Nishimura, Tokyo (JP); Megumi Senda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 16/891,094

(22) Filed: Jun. 3, 2020

(65) Prior Publication Data
US 2020/0295303 A1    Sep. 17, 2020

Related U.S. Application Data

(63) Continuation of application No. PCT/JP2018/033639, filed on Sep. 11, 2018.

(30) Foreign Application Priority Data

Dec. 4, 2017 (JP) .............................. JP2017-232684

(51) Int. Cl.
*H01L 51/00*    (2006.01)
*H01L 51/52*    (2006.01)
(Continued)

(52) U.S. Cl.
CPC .... *H01L 51/5256* (2013.01); *G02F 1/133528* (2013.01); *H01L 27/323* (2013.01);
(Continued)

(58) Field of Classification Search
CPC ............. H01L 51/5256; H01L 51/0097; H01L 51/5253; H01L 51/5293; H01L 2251/5338;
(Continued)

(56) References Cited

U.S. PATENT DOCUMENTS 9,349,969 B2 * 5/2016 Kwon ................. H01L 51/0097
9,935,281 B2 * 4/2018 Kim ..................... H01L 27/3276
(Continued)

FOREIGN PATENT DOCUMENTS

CN    106449699 A    2/2017
JP    2017-003963 A    1/2017
(Continued)

OTHER PUBLICATIONS

International Search Report and Written Opinion dated Nov. 20, 2018 for PCT/JP2018/033639 filed on Sep. 11, 2018, 11 pages including English Translation of the International Search Report.
(Continued)

*Primary Examiner* — Ida M Soward
(74) *Attorney, Agent, or Firm* — Xsensus LLP

(57) ABSTRACT

A display device includes a protection coating having a precisely controlled thickness. The display device includes: a display panel including a display area, a terminal area on which terminals are disposed, and a bent area located between the display area and the terminal area, wherein the bent area is bent such that the terminal area is located below the backside of the display area; a film on the frontside of the display area; a film on the frontside of the display area; an optically transparent plate on the frontside of the film; and a protection coating disposed on the frontside of the bent area, wherein one end of the film faces one end of the protection coating, and the optically transparent plate covers the end of the protection coating and is bonded to the end of the protection coating.

11 Claims, 10 Drawing Sheets

(51) Int. Cl.
   *H01L 27/32* (2006.01)
   *H01L 27/14* (2006.01)
   *H01L 33/44* (2010.01)
   *G02F 1/1335* (2006.01)
   *H01L 27/146* (2006.01)

(52) U.S. Cl.
   CPC .... *H01L 51/0097* (2013.01); *H01L 27/14678* (2013.01); *H01L 33/44* (2013.01); *H01L 51/5293* (2013.01); *H01L 2251/5338* (2013.01)

(58) Field of Classification Search
   CPC . H01L 27/323; H01L 27/14678; H01L 33/44; G02F 1/133528
   See application file for complete search history.

(56) References Cited

U.S. PATENT DOCUMENTS

| | | | |
|---|---|---|---|
| 9,960,317 B2 * | 5/2018 | Toribatake | H01L 23/544 |
| 9,985,086 B2 * | 5/2018 | Kwon | H01L 51/0097 |
| 9,991,456 B2 * | 6/2018 | Senda | H01L 51/0097 |
| 9,991,467 B2 * | 6/2018 | Namkung | H01L 51/5253 |
| 10,319,939 B2 * | 6/2019 | Seong | H01L 51/56 |
| 10,388,713 B2 * | 8/2019 | Son | H01L 51/0097 |
| 10,490,755 B2 * | 11/2019 | Jang | H01L 27/013 |
| 10,496,136 B2 * | 12/2019 | Kim | G06F 1/1652 |
| 10,522,783 B2 * | 12/2019 | Jo | H01L 51/5253 |
| 11,031,564 B2 * | 6/2021 | Nishimura | H01L 51/5212 |
| 11,086,364 B2 * | 8/2021 | Yamazaki | G09F 9/00 |
| 2016/0172428 A1 | 6/2016 | Song et al. | |
| 2017/0047547 A1 | 2/2017 | Son et al. | |
| 2017/0237027 A1 * | 8/2017 | Lee | H01L 51/5246 257/40 |
| 2018/0047938 A1 * | 2/2018 | Kishimoto | H01L 27/323 |
| 2018/0062095 A1 * | 3/2018 | Andou | H01L 27/3248 |
| 2018/0304590 A1 | 10/2018 | Fukatani et al. | |
| 2019/0341443 A1 * | 11/2019 | Son | H01L 51/56 |
| 2021/0132726 A1 * | 5/2021 | Ryu | H01L 51/56 |
| 2021/0265581 A1 * | 8/2021 | Nishimura | H01L 27/3246 |

FOREIGN PATENT DOCUMENTS

| | | | | |
|---|---|---|---|---|
| JP | 2017-149956 A | | 8/2017 | |
| JP | 2018105976 A | * | 7/2018 | G02F 1/13452 |

OTHER PUBLICATIONS

Office Action dated Jul. 2, 2021 in Chinese Patent Application No. 201880077938.X, 12 pages.

* cited by examiner

DISPLAY DEVICE HAVING AN OPTICALLY TRANSPARENT PLATE

CROSS-REFERENCE TO RELATED APPLICATION

This application is a continuation application of International Application PCT/JP2018/033639 filed on Sep. 11, 2018, which claims priority from Japanese patent application JP2017-232684 filed on Dec. 4, 2017. The contents of these applications are incorporated herein by reference in their entirety.

BACKGROUND OF THE INVENTION

1. Field of the Invention

The present invention relates to a display device.

2. Description of the Related Art

Recently, as a display device tends to have the larger respective display area, it is required to reduce a peripheral area, that is, a frame area of the display device. Especially, a mobile device like a smart phone is strongly required to have a smaller frame area of the mobile device.

For example, US2016/0172428A1 disclose a flexible display device comprising a flexible substrate a resin film and a flexible display panel on the flexible substrate, wherein a peripheral area of a display area of the flexible display panel is sent toward a backward of the flexible di ay device reduce a frame area.

SUMMARY OF THE INVENTION

Bending of the display panel may generate a stress on the bent area of the display panel and thereby destroy wiring of a circuitry of the flexible display device. Thus, a protection coating can be applied to the bent area of the flexible display device to protect the wiring.

Such a protection film is formed by applying liquid resin material to the bent area and then curing the liquid resin material, such that ends of the protection coating cover the respective ends of a film on a front side of the display panel.

However, since the bent area has a step, application of the liquid resin material to the bent area may cause the liquid resin material to flow out, which would make it difficult to achieve a desired thickness of the protection coating. As a result, a desired bending property cannot be obtained.

Considering above, it is an object of the present invention to provide a display device comprising a protection coating having a precisely controlled thickness.

To solve the above-mentioned problem, a display device of the present invention comprises: a display panel including a display area, a terminal area on which terminals are disposed, and a bent area located between the display area and the terminal area, wherein the bent area is bent such that the terminal area is located below the backside of the display area; a film on the frontside of the display area; a film on the frontside of the display area; an optically transparent plate on the frontside of the film; and a protection coating disposed on the frontside of the bent area, wherein one end of the film faces one end of the protection coating, and the optically transparent plate covers the end of the protection coating and is bonded to the end of the protection coating.

BRIEF DESCRIPTION OF THE DRAWINGS

Hereinafter, embodiments of the present invention will be described in detail with reference to the drawings in which.

DETAILED DESCRIPTION OF THE INVENTION

Figure 1:
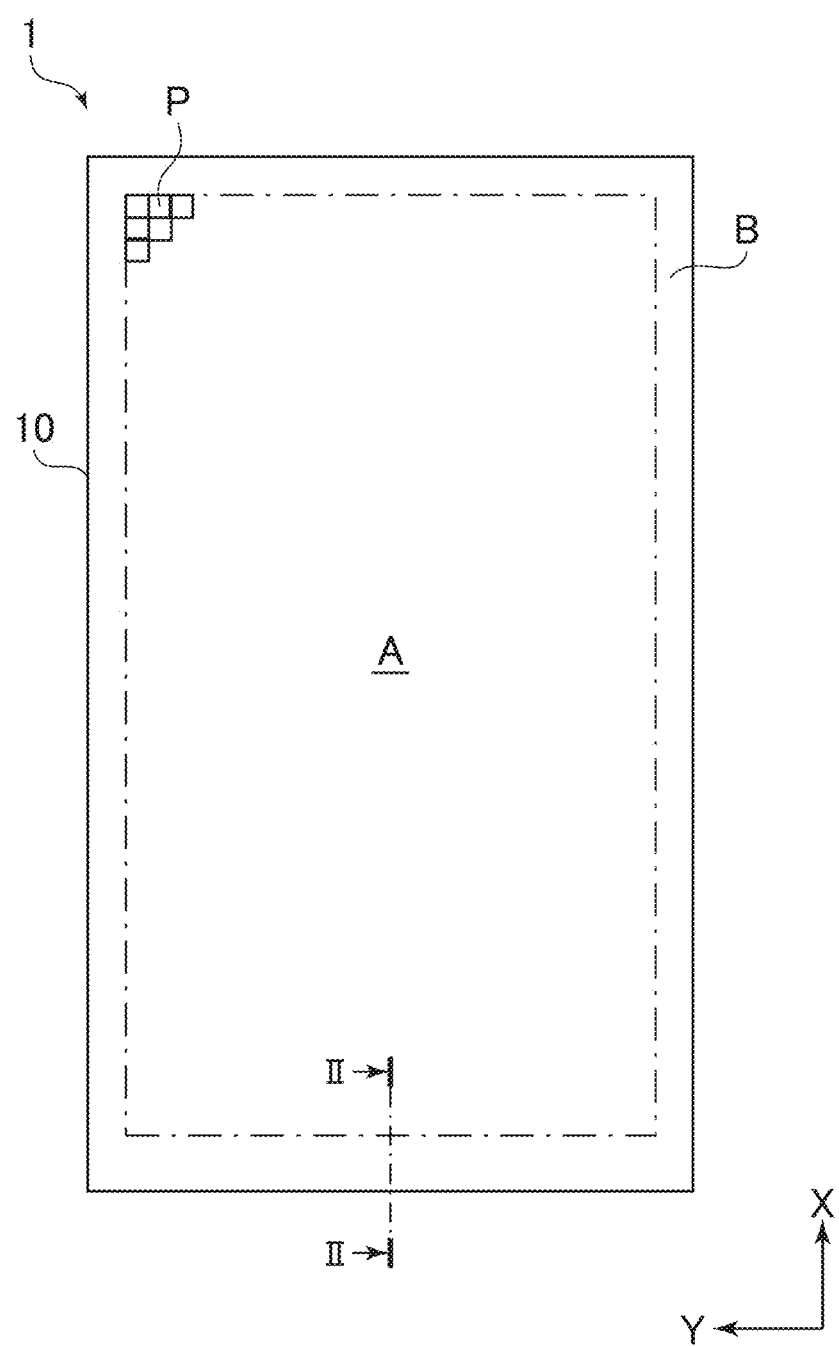
FIG. 1 shows a plan view of a display device according to an embodiment.

Hereinafter, embodiments of the present invention are described below with reference to the drawings. For clearer description, drawings may be schematically illustrated in terms of a width, a thickness, a shape, and the like of each part as compared to the actual embodiment, but this is merely an example and do not limit the interpretation of the present invention. In the specification and the drawings, components similar to those described with respect to a previous drawing are denoted by the same reference numerals, and detailed descriptions thereof are appropriately omitted.

Further, in the detailed description of the present invention, when defining the positional relationship between a certain component and another component, "upper" and "below" include not only the case of being positioned immediately above or immediately below a certain component, but also the case of interposing another component in between, unless otherwise specified.

Figure 2:
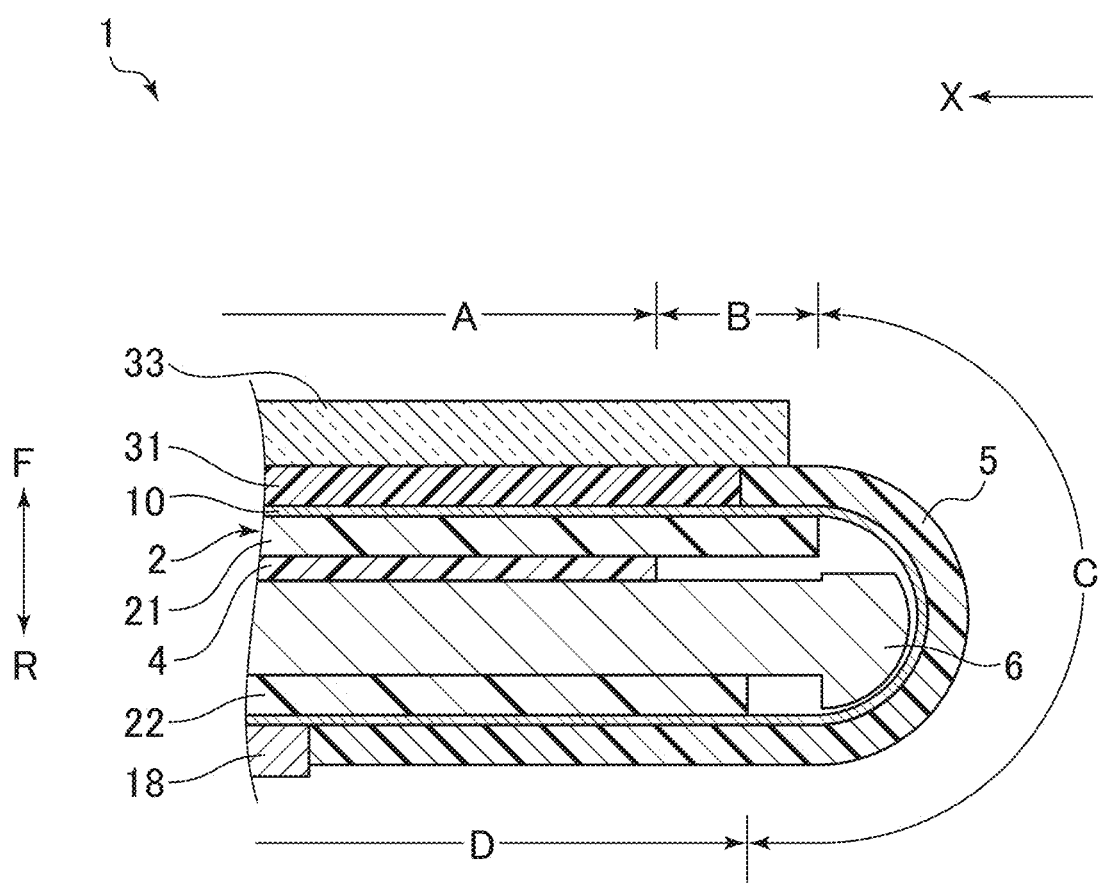
FIG. 2 shows a cross-sectional view of the display device along a II-II line in FIG. 1.
Figure 3:
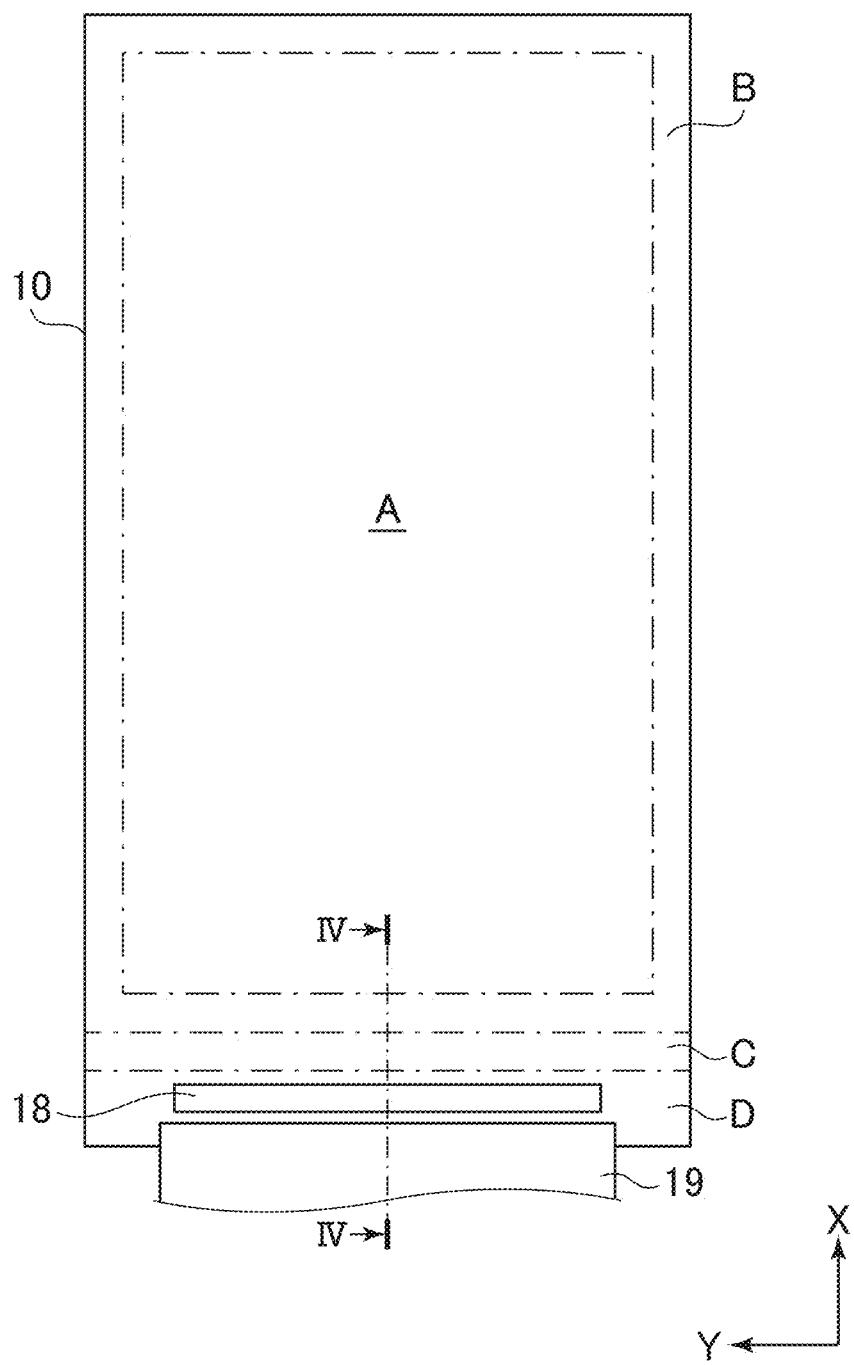
FIG. 3 shows a plan view of a display panel according to an embodiment before being bent.
Figure 4:
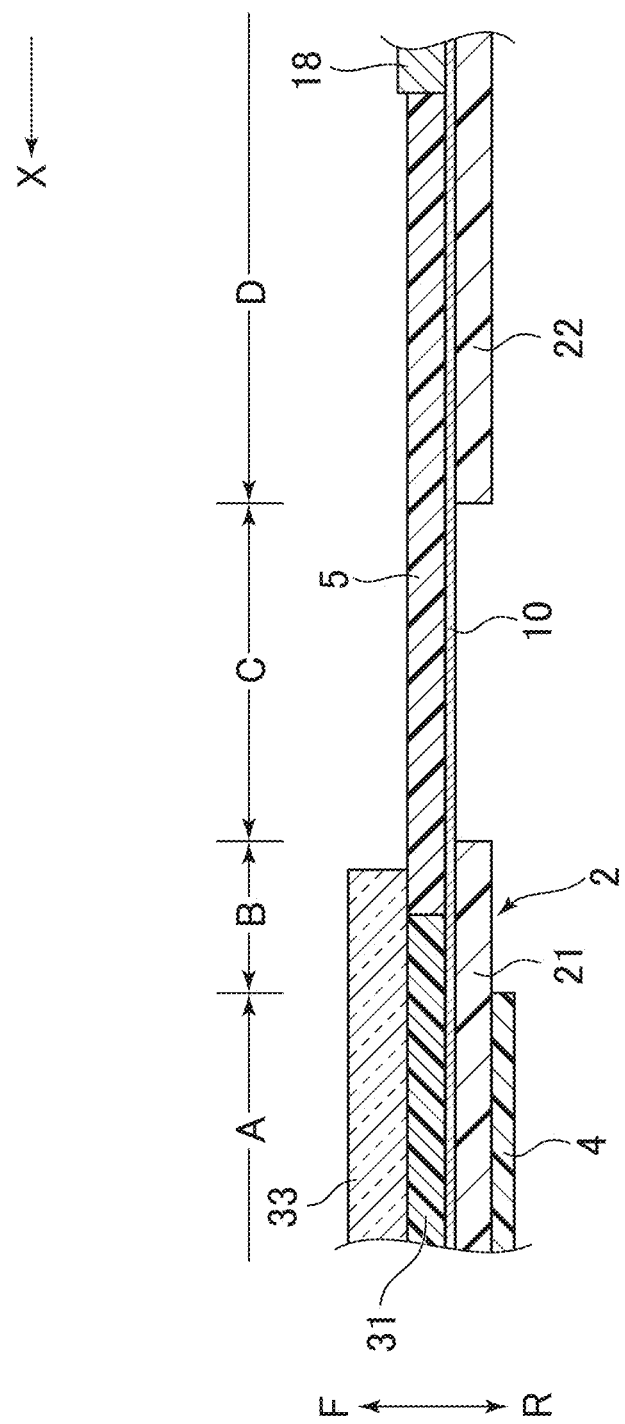
FIG. 4 shows a cross-sectional view of the display panel along a IV-IV line in FIG. 3.

FIG. 1 shows a plan view of a display device 1 according to an embodiment. FIG. 2 shows a cross-sectional view of the display device 1 along a II-II line in FIG. 1. FIG. 3 shows a plan view of a display panel 10 before being bent. FIG. 4 shows a cross-sectional view of the display panel along a IV-IV line in FIG. 3.

The display device 1 is, for example, an organic electroluminescence (EL) display device comprising organic EL diodes (OLEDs) as a display element. The display device 1 comprises a bendable display panel 10 having a flexible film as a substrate. The flexible film is formed from resin such as polyimide. The display panel 10 comprises a display area A, a frame area B surrounding the display area A, a bent area C abutting one edge of the frame area B, and a terminal area D abutting the bent area C.

In FIGS. 1-4, A X direction refers to a direction along which the display area A, the bent area C and the frame area B are arranged, and a Y direction refers to an orthogonal direction to the X direction. In FIGS. 2 and 4, a F direction refers to a direction toward a frontside of the display device, and a R direction refers to a direction toward a backside of the display device.

In the display area A, full color pixels P are arranged in matrix. Each full color pixel consists of, for example, red, green and blue subpixels combined to realize full color. In the frame area B, a peripheral electric circuitry can be located. In the terminal area D, terminals (not shown) are disposed, and an IC (integrated circuit) chip 18 is connected to a FPC (flexible printed circuit) 19. The IC chip can be implemented on the FPC 19.

The full color pixels P in the display area A are electrically connected to the terminals in the terminal area D via wiring extending through the frame area B and the bent area C. The display panel 10 is bent in the bent area C, and the terminal area D is located on the backside of the display area A. Thus, reduction of the frame area is realized.

As shown FIGS. 2 and 4, a frontside film 31 is disposed on the frontside of the display panel 10. The frontside film 31 is an optically transparent film formed from resin material such as cycloolefin polymer (COP) or triacetyl cellulose (TAC), and is bonded to the display panel 10 via, for example, a resin binder. The frontside film 31 can comprise a touch sensor.

A polarizer 33 is disposed on the frontside of the frontside film 31. The polarizer 33 is one example of an optically transparent plate. The polarizer 33 is, for example, is bonded to the frontside film 31 via a resin binder. A cover glass can be disposed on the polarizer 33. The cover glass can be one example of an optically transparent plate.

A backside film 2 is disposed on the backside of the display panel 10. The backside film 2 is formed from resin material such as polyethylene terephthalate (PET), and is bonded to the display panel 10 via, for example, a resin binder. The backside film 2 comprises a first film portion 21 bonded to the backside of the display area A and frame area B and a second film portion 22 bonded to the backside of the terminal area D. The backside film 2 is not bonded to the bent area C.

Bending of the bent area C makes the terminal area D and the second film portion 22 locate below the backsides of the display area A, the frame area B and the first film portion 21. In other words, the first and second film portions 21, 22 are located inside the bent display panel 10. The backside of the first film portion 21 faces the backside of the second film portion 22.

A stacked film 4 is glued on the backside of the first film portion 21. The stacked film 4 includes a buffer film, a heat dissipation film and a bonding tape, for example. The buffer film, sometimes called a cushion tape, is formed from resin foam material, for example. The heat dissipation film is formed from graphite or metal such as cupper.

A spacer 6 is disposed between the first film portion 21 and the second film portion 22 of the backside film 2 so as to guide bending of the bent area C of the display panel 10. The spacer 6 is sandwiched between the first film portion 21 and the second film portion 22, and abuts on the backside of the bent area C. The spacer 6 prevents the bent area C from over-bending and keeps the bending of the bent area C constant.

A protection coating 5 is disposed on the frontside of the bent area C. The protection coating 5 is formed from resin material such as acrylic resin or epoxy resin, for example. The protection coating 5 is formed by applying liquid resin material to the frontside of the bent area and then hardening the liquid resin material, for example. Thickness of the display panel 10 ranges from a few micron to a few tens of micron, for example. Thickness of the protection coating 5 ranges from a few tens of micron to a few hundreds of micron, for example. Details of the protection coating 5 will be described below.

Figure 5:
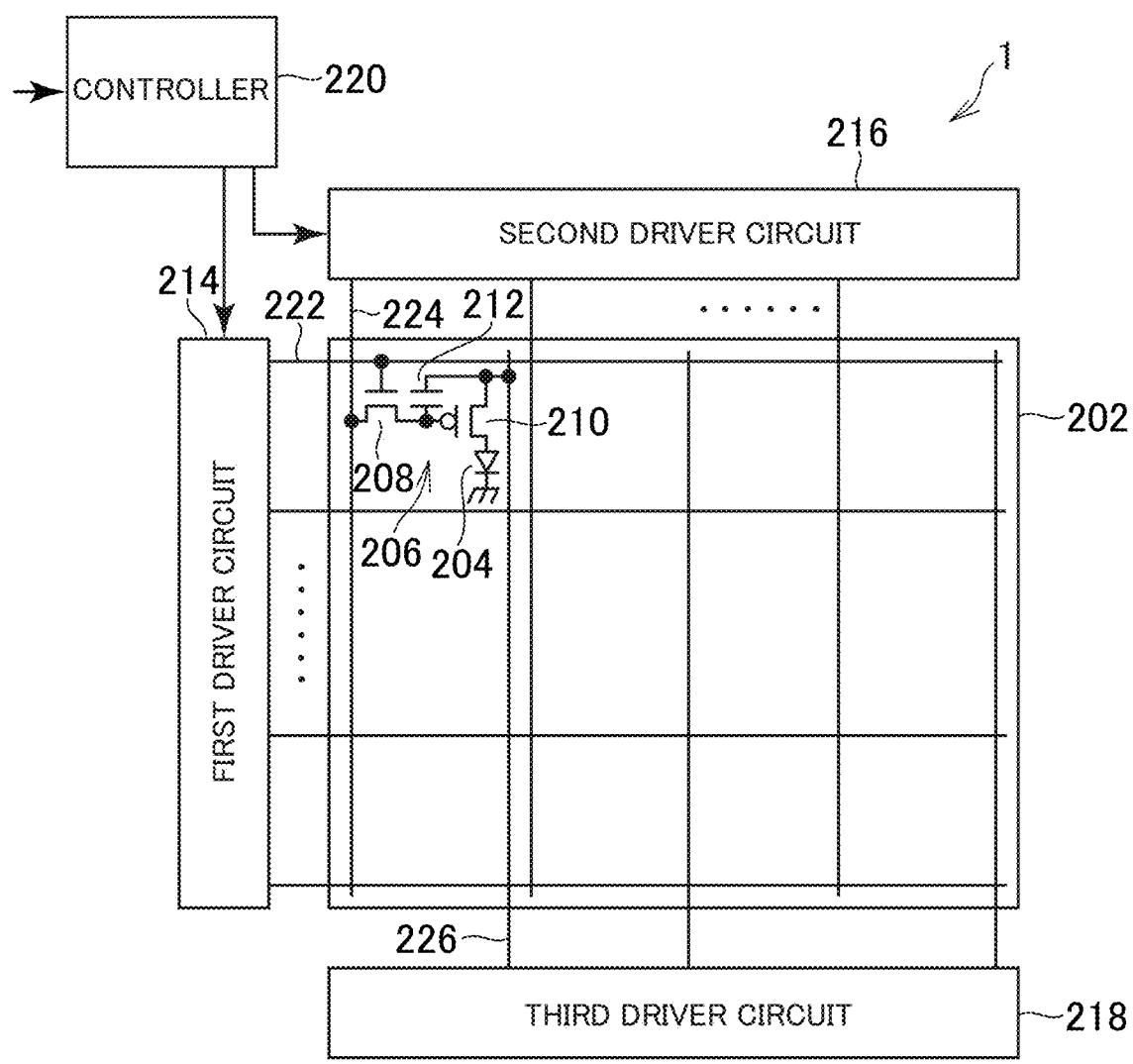
FIG. 5 shows a block diagram of electric configuration of a display device according to an embodiment.

FIG. 5 shows a block diagram of electric configuration of the display device 1. The display device 1 comprises a pixel array unit 202 on the display area A (see FIG. 1). FIG. 5 also shows a circuitry of a unit pixel included in the pixel array unit 202. The unit pixel includes an organic light-emitting diode (OLED) 204 and a pixel circuitry 206. The pixel circuitry 206 includes a sampling TFT 208, a driver TFT 210, and a capacitor 212. The driver TFT 210 is, for example, a p-type MOSFET.

The display device 1 further comprises a first driver circuit 214 configured to drive the pixel array unit 202, a second driver circuit 216, a third driver circuit 218 and a controller 220. The first driver circuit 214, the second driver circuit 216, and the third driver circuit 218 are disposed in the frame area B (see FIG. 1).

The first driver circuit 214 is connected to scan signal lines 222, each scan signal line arranged on the respective horizontal line of unit pixels (a pixel row). The first driver circuit 214 is configured to apply voltage to the scan signal lines 222 to successively turn on the respective sampling TFTs 208 (in other words, successively select the pixel rows) depending on timing signals from the controller 220.

The second driver circuit 216 is connected to image signal lines 224, each image signal line arranged on the respective vertical line of unit pixels (a pixel column). The second driver circuit 216 is configured to apply voltage to the respective sampling TFTs 208 in the selected pixel rows by the first driver circuit 214, the voltage depending on image signals from the controller 220. As a result, the voltage depending on the selected pixel rows is stored to the respective capacitors 212 in the selected pixel rows via the sampling TFTs 208.

The third driver circuit 218 is connected to driver power source lines 226, each driver power source line arranged on the respective vertical line of unit pixels (the vertical pixel column). The third driver circuit 218 is configured to supply electric current to the OLED 204 via the driver power source lines 226 and the driver TFTs 210. Then, the driver TFTs 210 are configured to supply electric current corresponding to the voltage stored to the respective capacitors 212 to the respective OLED 204. That causes the OLEDs 204 to emit light.

Figure 6:
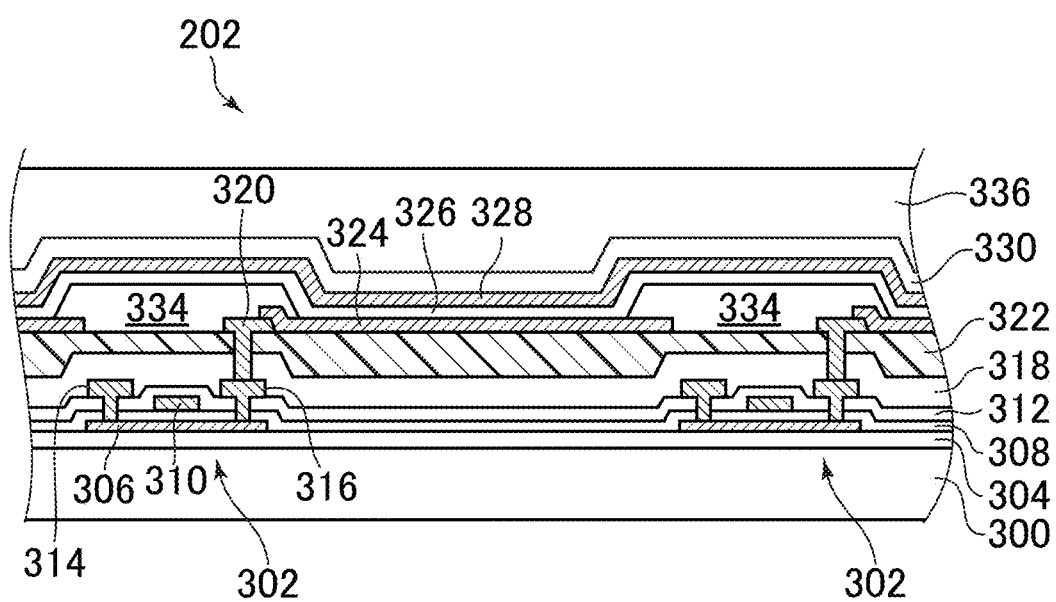
FIG. 6 shows a cross-sectional structure of a display device according to an embodiment.

FIG. 6 shows a cross-sectional structure of a pixel array unit 202 device. In FIG. 6, hatching for some layers are omitted for the sake of clarity. In the following description, an upward direction is defined as a stacking direction.

A substrate 300 consists of flexible resin such as polyimide. The upper side of the substrate 300 is covered with an undercoat layer 304. A semiconductor layer 306 is deposited on the undercoat layer 304, and covered with a gate insulating layer 308. A gate electrode 310 is formed on the gate insulating layer 308, and covered with a passivation layer 312. A drain electrode 314 and a source electrode 316 are connected to the semiconductor layer 306 through the gate insulating layer 308 and the passivation layer 312. The semiconductor layer 306, the gate electrode 310, the drain electrode 314 and the source electrode 316 form a thin film transistor 302. The thin film transistor 302 is arranged so as to correspond to the respective unit pixel of the unit pixels. The undercoat layer 304, the gate insulating layer 308 and the passivation layer 312 are formed from inorganic insulating material such as $SiO_2$ or SiN. The semiconductor layer 306 is formed from semiconductor such as LTPS (Low Temperature Poly-silicon).

The drain electrode 314 and the source electrode 316 are covered with an interlayer insulating film 318. The interlayer insulating film 318 is covered with a planarization film 322. The drain electrode 314 and the source electrode 316 are formed from electrically conductive material including Al, Ag, Cu, Ni, Ti, and Mo. The interlayer insulating film 318 is formed from inorganic insulating material such as $SiO_2$ or SiN. The planarization film 322 is formed from organic insulating material such as acrylic resin, and has a planar upper surface.

A pixel electrode 324 is formed on the planarization film 322. The pixel electrode 324 is connected to a connection electrode 320 which is connected to the source electrode 316 through the planarization film 322 and the interlayer insulating film 318. The pixel electrode 324 is arranged so as to correspond to the respective unit pixel. In the present embodiment, the display panel 10 is a top emission type, and the pixel electrode 324 is formed as a reflection electrode. The pixel electrode 324 comprises conductive material such as Al, Ag, Cu, Ni, Ti, Mo, and conductive oxide such as ITO and IZO.

The pixel electrode 324 is covered with a pixel separation film 334. The pixel separation film 334 is also called as a rib or bank. The pixel separation film 334 has an opening formed in the pixel separation film 334, through which the pixel electrode 324 is exposed downwardly. An inner part of the pixel separation film 334, which forms the opening, is disposed on a peripheral part of the pixel electrode 324. The pixel separation film 334 has a tapered shape in c cross-sectional view, i.e., the width of the pixel separation film 334 expands from bottom to top. The pixel separation film 334 is formed from organic insulating material such as acrylic resin or polyimide resin.

An emission layer 326 is formed on the exposed area of the pixel electrode 324 through the opening in the pixel separation film 334. In addition to the emission layer 326, at least one of a hole-transfer layer, a hole-injection layer, an electron-transfer layer, an electron-injection layer may be formed. The emission layer 326 is deposited such that the emission layer 326 is continuous across the opening and the pixel separation film 334, and uniform over the display area A (the emission layer 326 is so called a solid film). In this case, the emission layer 326 emits a monochromatic light. Each component, such as red, green, and blue, is extracted from a combination color by a color filter or color conversion layer. Alternatively, the emission layer 326 can by deposited via a make such that the emission layer 326 comprises several parts, each part separates from other part. In this case, the emission layer 326 emits several colors, such as red, green, and blue, each corresponding to the respective unit pixel. The emission layer 326 can be coated instead of deposition.

The emission layer 326 and the pixel separation film 334 are covered with a counter electrode 328. The counter electrode 328 is formed as a uniform film over the display area A (the counter electrode 328 is so called a solid film). The emission layer 326, and the pixel electrode 324 and the counter electrode 328 between which the emission layer 326 is sandwiched form an organic light-emitting diode (OLED). In the OLED, one of the pixel electrode 324 and the counter electrode 328 is anode while the other is cathode. Electric current flowing between the pixel electrode 324 and the counter electrode 328 causes the emission layer 326 to emit light. The counter electrode 328 is formed from transparent conductive material such as ITO or IZO, or metal film such as Mg, Ag.

The pixel separation film 334 and the counter electrode 328 are covered with a sealing film (passivation film) 330 to seal the pixel separation film 334 and the counter electrode 328 against water. The sealing film 330 is formed from inorganic insulating material such as $SiO_2$ or SiN. The sealing film 330 is covered with a protection film 336. The protection film 336 is formed from organic insulating material such as acrylic resin to secure a mechanical tolerance of the protection film 336.

Relationship among the protection coating 5, the frontside film 31 and the polarizer 33 will be described below. FIGS. 7-10 show first, second, third and fourth examples of the relationship among the protection coating 5, the frontside film 31 and the polarizer 33, respectively. In FIGS. 7-10, the frame area B and its vicinity are enlarged. In the following description, the term "inside" refers to a direction from the frame area B to the display area A (an X direction in FIGS. 7-10) while the term "outside" refers to a direction from the frame area B to the bent area C (opposite to the X direction in FIGS. 7-10).

The frontside film 31 is mainly disposed in the display area A while an end face 601 of the frontside film 31 is located outside of the display area A and thus in the frame area B. The end face 601 of the frontside film 31 faces toward outside.

The protection coating 5 is mainly disposed in the bent area C, and an end face 501 of the protection coating 5 is located inside the bent area C and thus in the frame area B. That is, the end face 501 of the protection coating 5 is located inside an end face 801 of the first film portion 21. The end face 501 of the protection coating 5 faces toward inside.

The protection coating 5 is located outside the frontside film 31. The end face 501 of the protection coating 5 faces the end face 601 of the frontside film 31. Thus, an end 505 of the protection coating 5 is not formed on the frontside film 31. The end 505 of the protection coating 5 includes the end face 501 of the protection coating 5.

The polarizer 33 is bonded to the upper surface 603 of the frontside film 31 via a binder 9. The upper surface 603 of the frontside film 31 is a front face of the frontside film 31. Furthermore, the polarizer 33 covers the end 505 of the protection coating 5, and is bonded to the end 505 of the protection coating 5. The binder 9 is interposed between the polarizer 33 and the end 505 of the protection coating 5.

This configuration is realized by disposing the frontside film 31 in the display area A of the display panel 10, disposing the protection coating 5 in the bent area C of the display panel 10, and disposing the polarizer 33 on the end 505 of the protection coating 5.

The polarizer 33 is mainly disposed in the display area A. An end 701 of the polarizer 33 is located outside the display area A and in the frame area B. The end 701 of the polarizer 33 faces toward outside.

The end 701 of the polarizer 33 is located outside the end face 601 of the frontside film 31. In other words, the end face 601 of the frontside film 31 is located inside the end 701 of the polarizer 33.

The end 701 of the polarizer 33 is located outside the end face 501 of the protection coating 5. In other words, the end face 501 of the protection coating 5 is located inside the end 701 of the polarizer 33.

The end 505 of the protection coating 5 is disposed between the polarizer 33 and the first film portion 21. That is, the first film portion 21, the protection coating 5 and the polarizer 33 are arranged vertically, and overlap in a plan view. In other words, the end 505 of the protection coating 5 is sandwiched between the polarizer 33 and the first film portion 21.

Figure 7:
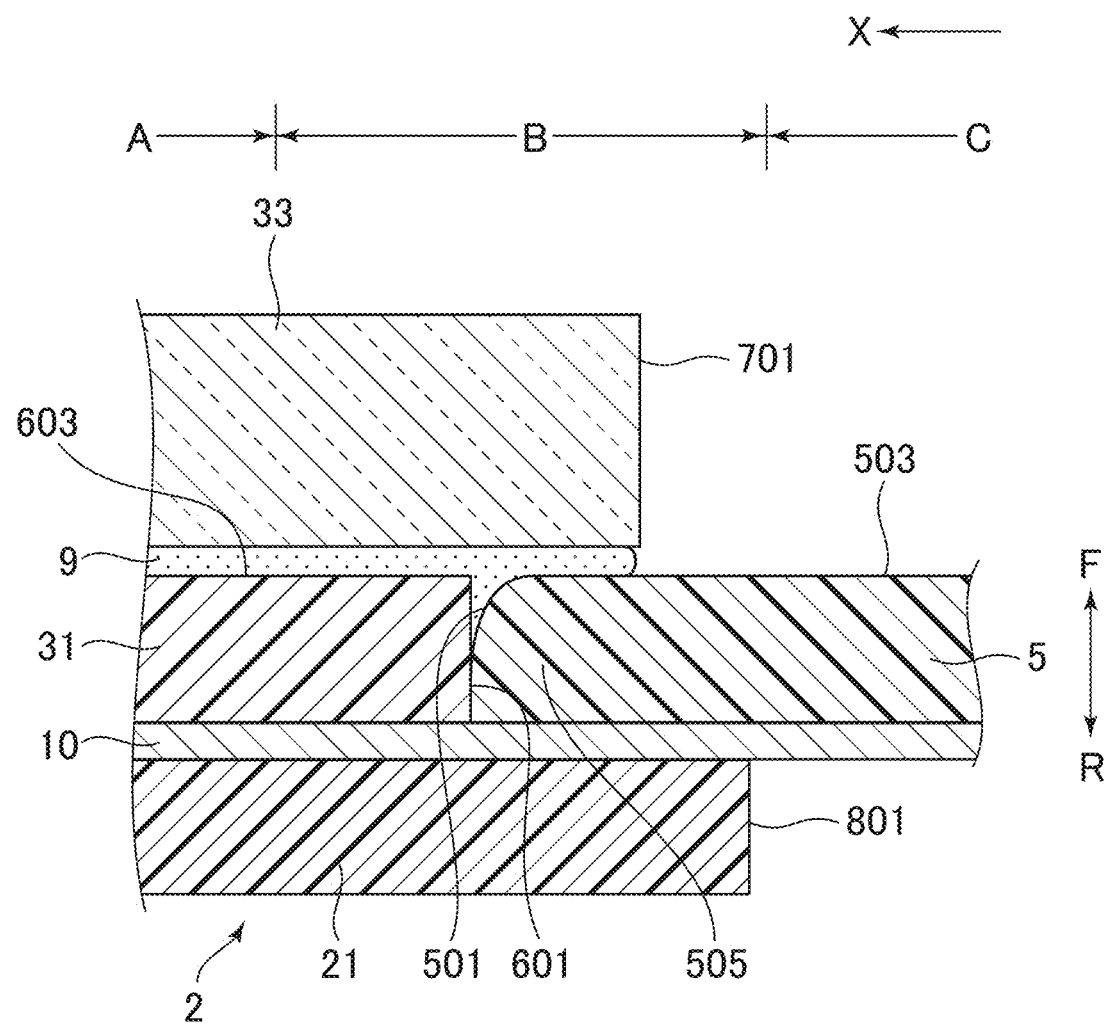
FIG. 7 shows a first example of a display device according to an embodiment.
Figure 8:
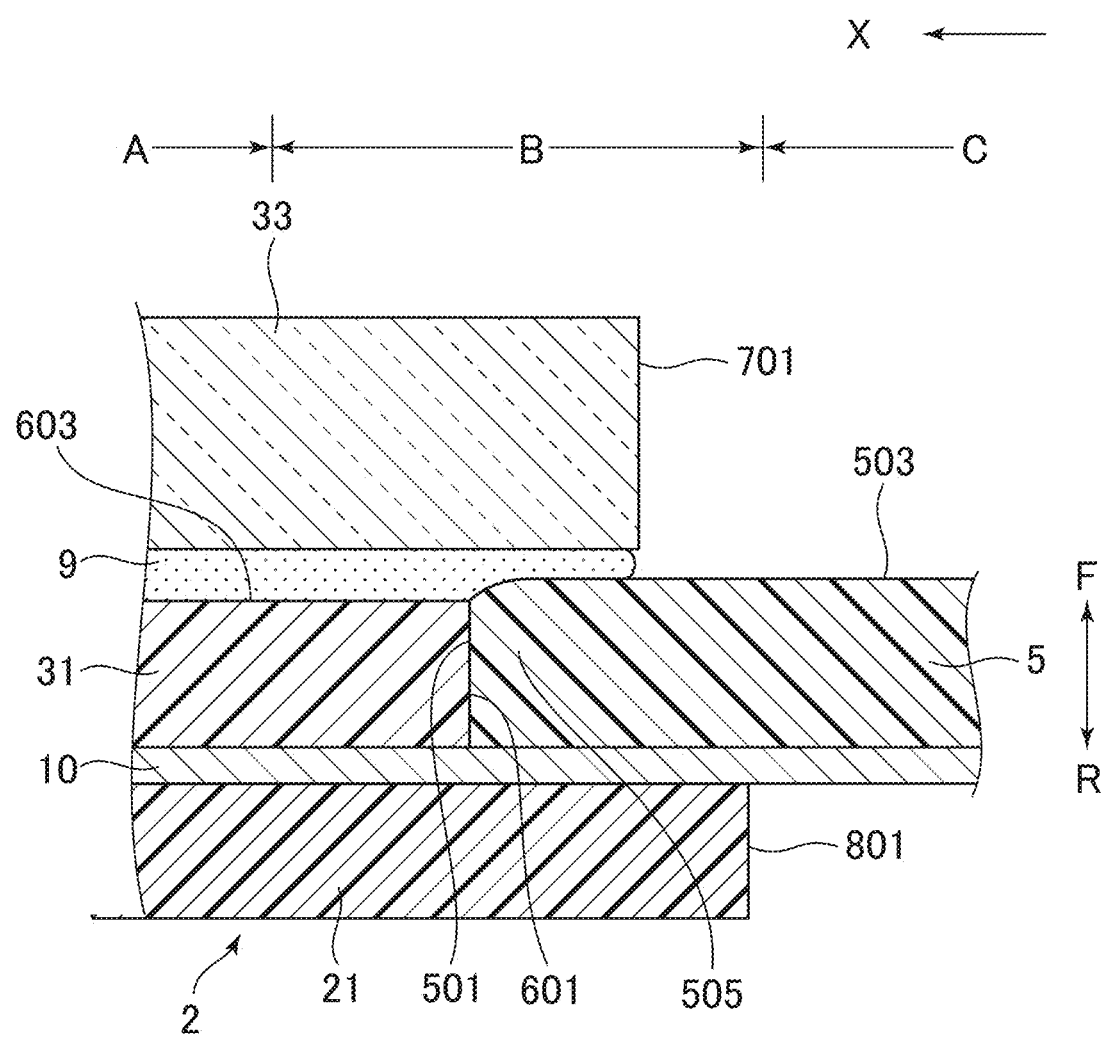
FIG. 8 shows a second example of a display device according to an embodiment.
Figure 9:
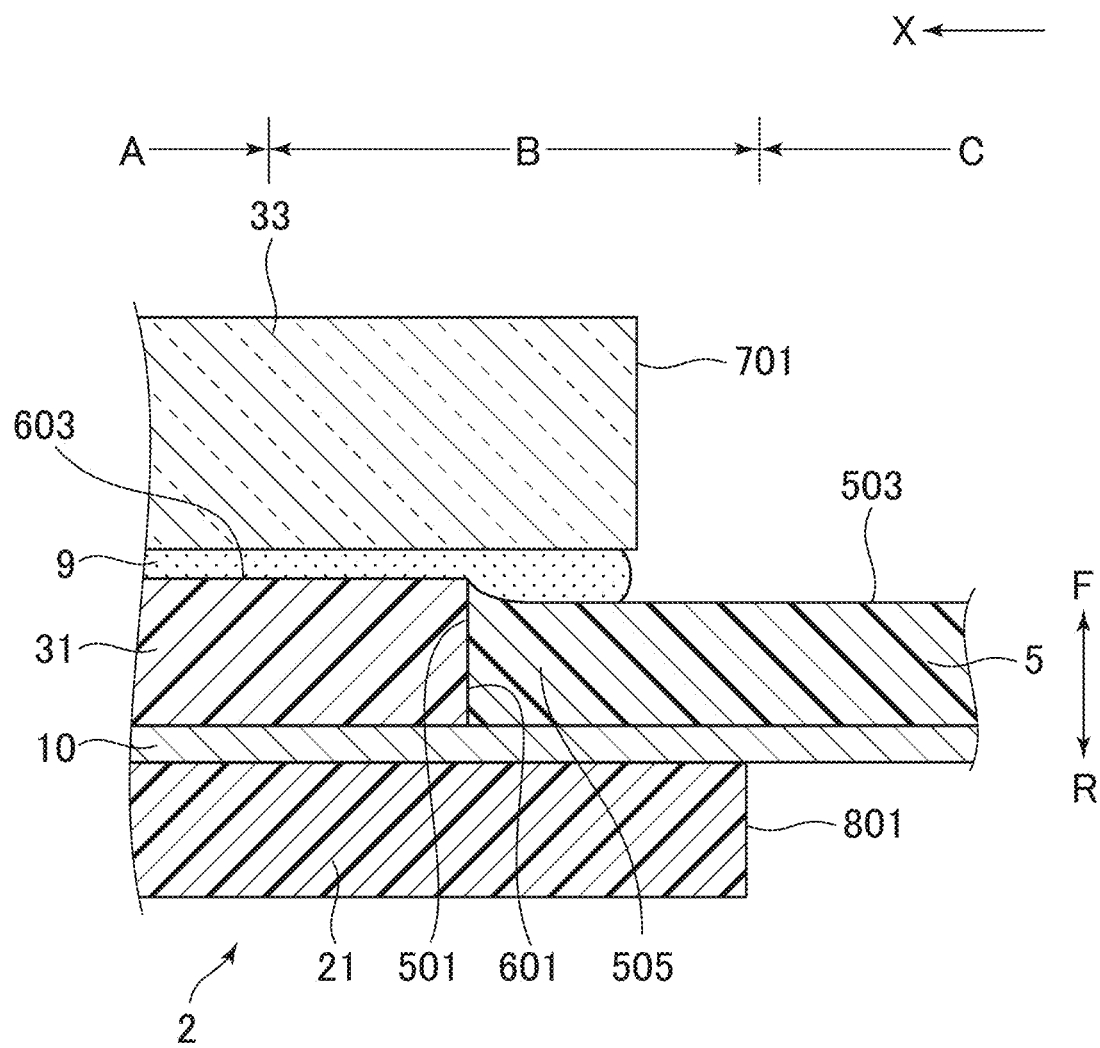
FIG. 9 shows a third example of a display device according to an embodiment.

The end face 601 of the frontside film 31 preferably contacts the end face 501 of the protection coating 5 as first, second and third examples shown in FIGS. 7-9 respectively. However, the end face 601 of the frontside film 31 can separate from the end face 501 of the protection coating 5 as a fourth example shown in FIG. 10. Although the end face 601 of the frontside film 31 contacts the end face 501 of the protection coating 5 at first, aging of the frontside film 31 and/or the protection coating 5 may make the end face 601 separate from the end face 501.

Figure 10:
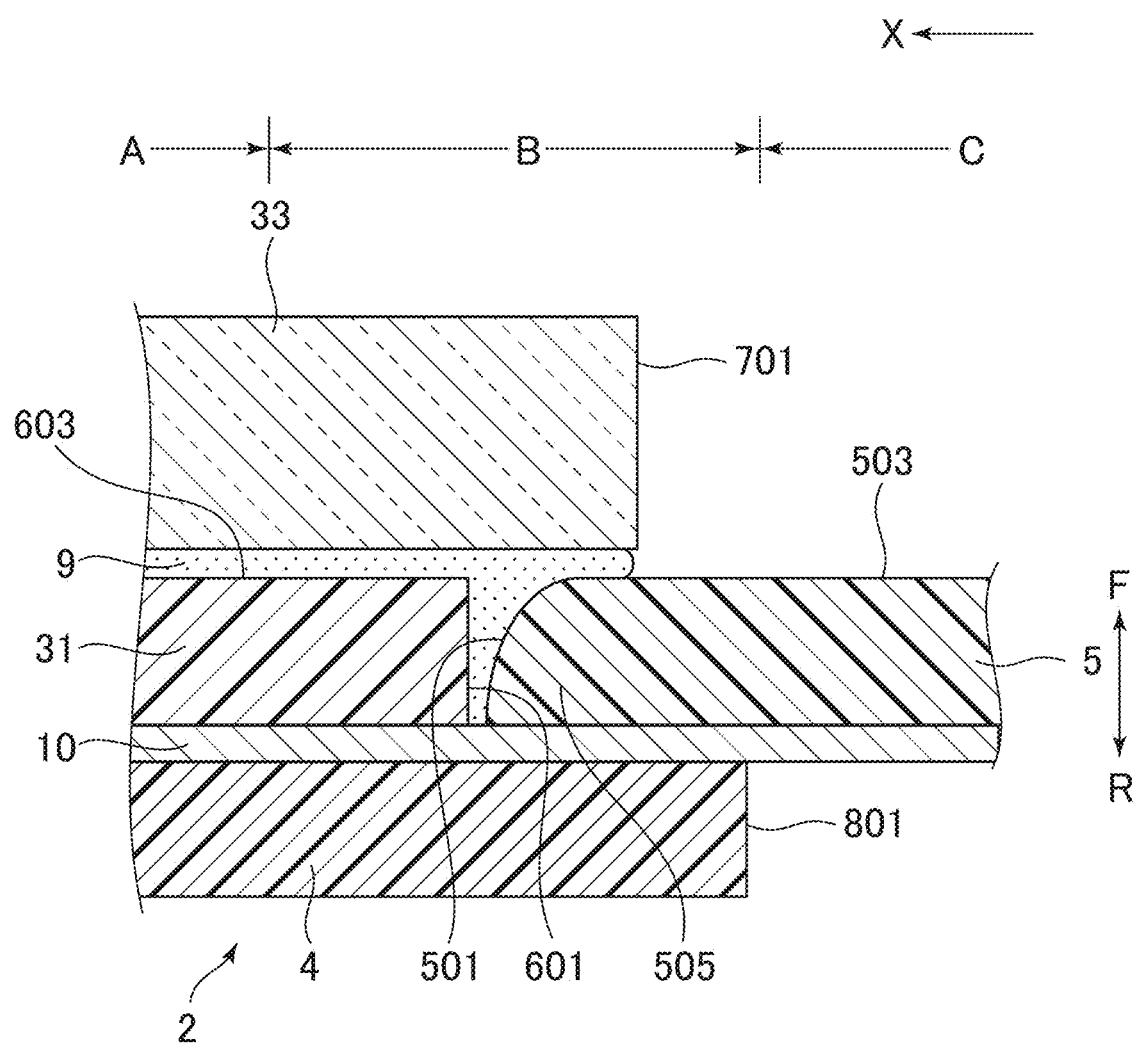
FIG. 10 shows a fourth example of a display device according to an embodiment

The end face 501 of the protection coating 5 is inclined downward toward the frontside film 31 due to surface tension which originates from the fact the protection coating 5 was liquid in the first, second and fourth examples shown in FIGS. 7-8 and 10. Alternatively, the upper surface 503 of the protection coating 5 is inclined upward toward the frontside film 31 in the third example shown in FIG. 9.

The upper surface 503 of the protection coating 5 has the same height as the upper surface 603 of the frontside film 31 as the first and fourth examples shown in FIGS. 7 and 10. However, the upper surface 503 can be higher than the upper surface 603 as the second example shown in FIG. 8, or the upper surface 503 can be lower than the upper surface 603 as the third example shown in FIG. 9.

In the above-mentioned embodiments, forming the end 505 of the protection coating 5 facing the end face 601 of the frontside film 31 without being deposited on the frontside film 31 enables precise control of thickness of the protection coating 5. This enables a desired thickness of the protection coating 5, and a desired bending of the protection coating 5.

Furthermore, although the end 505 of the protection coating 5 formed in the above-mentioned way is supposed to peel off the display panel 10 easily, the polarizer 33 bonded to the end 505 of the protection coating 5 to cover the end 505 can suppress peeling of the end 505 off the display panel 10.

In addition to or alternatively, a cover glass disposed on the polarizer 33 can be bonded to the end 505 of the protection coating 5 to cover the end 505.

In the above-mentioned embodiments, the frontside film comprises the frontside film 31 consisting of an optically transparent film (which can include a touch sensor) and the optically transparent plate comprises the polarizer 33 as an example. However, the present invention is not limited to the example. For example, the frontside film can be a polarizer (polarizer film) and the optically transparent plate can be a plate including a touch sensor. Alternatively, for example, the frontside film can be a film including a touch sensor and the optically transparent plate can be a cover glass. Alternatively, for example, the frontside film can be a polarizer (polarizer film) and the optically transparent plate can be a cover glass. The above-mentioned examples can be included in aspects shown in FIGS. 7-10.

Although an organic electro-luminescence display device is disclosed as an example in the present embodiment, the present invention can be applied to a liquid crystal display device, other emitting display device, or an electronic paper comprising an electrophoresis device, or any flat panel type display device. The present invention can be applied to the above-mentioned devices regardless of their size.

Within the scope of the idea of the present invention, those skilled in the art can easily conceive various changes and modifications, and it is understood that these changes and modifications also belong to the scope of the present invention. For example, with respect to each of the above embodiments, those obtained by appropriately adding or deleting components, or changing a design thereof, or adding or omitting a process or changing a condition thereof by those skilled in the art are included in the scope of the present invention, without departing from the gist of the present invention.

What is claimed is:

1. A display device comprising:
    a display panel including a display area, a terminal area on which terminals are disposed, and a bent area located between the display area and the terminal area, wherein the bent area is bent such that the terminal area is located below the backside of the display area;
    a film on the frontside of the display area;
    an optically transparent plate on the frontside of the film; and
    a protection coating disposed on the frontside of the bent area, wherein one end of the film faces one end of the protection coating, and the optically transparent plate covers the end of the protection coating and is bonded to the end of the protection coating.

2. The display device according to claim 1, wherein the end of the film contacts the end of the protection coating.

3. The display device according to claim 1, wherein the end of the protection coating is formed without being disposed on the film.

4. The display device according to claim 1, the end of the optically transparent plate is located outside the end of the film.

5. The display device according to claim 1, wherein the height of the upper surface of the protection coating is equal to or lower than the height of the upper surface of the film.

6. The display device according to claim 1, further comprising a further film disposed on the backside of the display area, wherein the end of the protection coating is located between the optically transparent plate and the further film.

7. The display device according to claim 1, further comprising a further film disposed on the backside of the display area, wherein the display panel and the end of the protection coating are sandwiched between the optically transparent plate and the further film.

8. The display device according to claim 1, wherein a binder is interposed between the optically transparent plate and the end of the protection coating.

9. The display device according to claim 1, wherein the optically transparent plate is bonded to the film and the end of protection coating.

10. The display device according to claim 1, wherein the optically transparent plate is a polarizer.

11. The display device according to claim 1, wherein the film comprises a touch sensor.

* * * * *